United States Patent
Freudenberg et al.

(10) Patent No.: US 9,371,597 B2
(45) Date of Patent: Jun. 21, 2016

(54) DEVICE AND METHOD FOR PRODUCING SILICON BLOCKS

(75) Inventors: Bernhard Freudenberg, Coburg (DE); Sara Grützner, Wilthen (DE); Marc Dietrich, Grossschirma (DE); Kaspars Dadzis, Freiberg (DE); Andreas Krause, Radebeul (DE); Bianca Gründig-Wendrock, Marienberg-Gebirge (DE); Doreen Nauert, Grossschirma (DE); Matthias Trempa, Erlangen (DE); Christian Reimann, Münchaurach (DE); Jochen Friedrich, Eckental (DE)

(73) Assignees: SolarWorld Innovations GmbH, Freiberg/Sachsen (DE); Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 1054 days.

(21) Appl. No.: 13/456,503

(22) Filed: Apr. 26, 2012

(65) Prior Publication Data

US 2013/0065032 A1    Mar. 14, 2013

(30) Foreign Application Priority Data

Sep. 13, 2011   (DE) .......................... 10 2011 082 628

(51) Int. Cl.

| | |
|---|---|
| *C30B 11/02* | (2006.01) |
| *C30B 11/00* | (2006.01) |
| *C30B 11/14* | (2006.01) |
| *C30B 29/06* | (2006.01) |
| *H01L 31/18* | (2006.01) |

(52) U.S. Cl.
CPC ............. *C30B 11/002* (2013.01); *C30B 11/003* (2013.01); *C30B 11/14* (2013.01); *C30B 29/06* (2013.01); *H01L 31/182* (2013.01); *Y02E 10/546* (2013.01); *Y02P 70/521* (2015.11); *Y10T 117/1092* (2015.01); *Y10T 428/24942* (2015.01)

(58) Field of Classification Search
CPC combination set(s) only.
See application file for complete search history.

(56) References Cited

U.S. PATENT DOCUMENTS

| | | | |
|---|---|---|---|
| 2002/0014574 A1* | 2/2002 | Wakita | ................. C30B 11/002 249/204 |
| 2008/0264207 A1 | 10/2008 | Muller et al. | |
| 2011/0203517 A1* | 8/2011 | Freudenberg | ........... C01B 33/02 117/81 |

FOREIGN PATENT DOCUMENTS

| | | |
|---|---|---|
| CN | 102066249 A | 5/2011 |
| DE | 10 2005 028 435 A1 | 1/2006 |
| DE | 10 2005 029 039 A1 | 2/2006 |

(Continued)

OTHER PUBLICATIONS

Chinese Office Action of Dec. 2, 2014.

*Primary Examiner* — Duy Deo
*Assistant Examiner* — Erin Bergner
(74) *Attorney, Agent, or Firm* — McGlew and Tuttle, P.C.

(57) ABSTRACT

Device for producing silicon blocks for photovoltaic applications, comprising a container for receiving a silicon melt with a base wall and at least one side wall, means for reducing the diffusion of impurities from at least one of the walls of the container into the silicon melt, wherein the means for reducing the diffusion of impurities comprise at least one covering element for the at least partial covering of at least one of the walls of the container.

23 Claims, 6 Drawing Sheets

(56) References Cited

FOREIGN PATENT DOCUMENTS

| DE | 10 2005 013 410 A1 | 9/2006 |
| DE | 10 2005 032 789 A1 | 12/2006 |
| DE | 10 2005 013 410 B4 | 1/2008 |
| EP | 2 431 338 A1 | 3/2012 |
| WO | 2009 153 152 A1 | 12/2009 |
| WO | 2010125739 A1 | 11/2010 |

* cited by examiner

DEVICE AND METHOD FOR PRODUCING SILICON BLOCKS

CROSS-REFERENCES TO RELATED APPLICATIONS

This application claims the priority of German Patent Application, Serial No. 10 2011 082 628.9, filed Sep. 13, 2011, pursuant to 35 U.S.C. 119(a)-(d), the content of which is incorporated herein by reference in its entirety as if fully set forth herein.

FIELD OF THE INVENTION

The invention relates to a device for producing silicon blocks. In addition, the invention relates to a method for producing silicon blocks and to silicon blocks.

BACKGROUND OF THE INVENTION

The production of large-volume semiconductor bodies, in particular silicon blocks, is of fundamental importance for the production of silicon solar cells. Melting crucibles, in which a silicon melt is solidified, are generally used to produce silicon blocks. A device and a method for producing silicon blocks is known, for example, from DE 10 2005 013 410 A1.

There is continuously a need to further develop devices and methods for producing silicon blocks. This object is achieved by a device for producing silicon blocks for photovoltaic applications, comprising a container for receiving a silicon melt with a base wall and at least one side wall, and comprising means for reducing the diffusion of impurities from at least one of the walls of the container into the silicon melt and the silicon block, wherein the means for reducing the diffusion of impurities comprise at least one covering element to at least partially cover at least one of the walls of the container. This object is further achieved by a method for producing silicon blocks, comprising the steps of providing a container to receive a silicon melt comprising a base wall and at least one side wall, providing and arranging a means for separating the silicon melt in the container from the base wall thereof, providing a silicon melt in the container, and solidifying the silicon melt.

SUMMARY OF THE INVENTION

A core of the invention is to arrange a diffusion barrier in a crucible for receiving a silicon melt. The diffusion barrier is used to reduce the diffusion of impurities from the crucible into the melt and into the crystal. The achievable yield is increased by this.

An insertion or covering element, which is configured as an insertion plate or insertion foil and is inserted into the crucible, is preferably provided as the diffusion barrier. This allows a particularly simple arrangement of the diffusion barrier in the crucible. The rigid insertion plate and the flexible insertion foil are collectively called the covering element.

The insertion plate may have a one-piece configuration. It may also comprise a plurality of part plates. The term "insertion plate" is also taken to means the multi-part configuration below. The same applies to the insertion foil.

The covering element, in particular the insertion plate, is adapted to the dimensions of the container. It is preferably configured in such a way that the base wall and/or at least one of the side walls, in particular all the side walls of the crucible, can be covered by it as far as possible completely. The base wall and/or the respective side wall(s) of the crucible can be in particular at least 90%, in particular at least 95%, in particular at least 99%, in particular 99.9%, preferably completely, covered by the insertion plate. The more complete the covering of the walls of the crucible by means of the insertion plate, the more effectively is a diffusion of impurities from the crucible into the melt and/or the crystal prevented. The insertion plate leads to a spatial separation of the silicon melt or the silicon crystal from the base wall and/or the side walls of the crucible.

The covering element is preferably made of a material, which has a melting point, which is above the melting point of silicon. As a result, a melting of the diffusion barrier in the silicon melt is prevented by this.

The covering element is preferably made from a material having a smaller diffusion constant of impurities (such as, for example, of transition metals) in relation to silicon. The diffusion content of the material of the covering element in relation to silicon at temperatures in the range from 20° C. to 1500° C., in particular in the range from 800° C. to 1412° C., is smaller than the diffusion constants of one of the elements selected from the group of the above-mentioned impurities, in particular of iron, in relation to silicon. It is, in particular, at most 0.5 times, in particular at most 0.3 times, in particular at most 0.2 times as large as the diffusion constant of one of the transition metals titanium, vanadium, chromium, manganese, iron, cobalt or nickel in relation to silicon at the corresponding temperatures. This ensures that no significant diffusion of metal impurities occurs from the diffusion barrier into the silicon melt or the silicon crystal. The diffusion of metallic components of the diffusion barrier into the silicon melt or the silicon crystal is, in particular, limited to a boundary layer with a thickness of at most 1 μm, in particular at most 500 nm, in particular at most 300 nm.

The diffusion constant of the diffusion barrier in relation to the above-mentioned transition metals is preferably smaller than the corresponding diffusion constant of the $SiO_2$ melting crucible, in particular, the diffusion constant of the diffusion barrier is less than $10^{-11}$ $m^2/s$.

In addition to its function as a diffusion barrier, the covering element can preferably simultaneously form a nucleus template for the crystallization of the silicon melt.

The covering element is preferably made of a material, which has a lower diffusion constant for transition metals, in particular for iron, than the diffusion constant thereof in silicon. The diffusion constant of the material of the covering element in relation to transition metals, in particular in relation to iron, is in particular so low that it is ensured that substances of this type do not diffuse through the diffusion barrier when the silicon melt solidifies. As a result, the barrier effect of the covering element is ensured.

The covering element may, for example, be produced from a refractory metal, in particular selected from the group of molybdenum (Mo), tungsten (W) and titanium (Ti), or a compound of one or more of these substances. It may be made of quartz, silicon dioxide, silicon carbide or silicon nitride. In general, it has at least one fraction selected from the group of refractory metals, compounds thereof, quartz, silicon dioxide, silicon carbide and silicon nitride and other compounds from the quaternary system Si—C—O—N. Moreover, the covering element may have a component of aluminum oxide, of multicrystalline $Al_2O_3$ or of monocrystalline sapphire. The covering element may also consist completely of one or more of these materials.

In principle, it is also possible to configure the insertion plate from a flat carrier element, which, on at least one side, in particular on both sides, in particular completely, has a layer of at least one of the above-mentioned materials.

A wafer, in particular a silicon carbide wafer or silicon dioxide wafer, may also be used, for example, as the insertion plate.

In an advantageous embodiment, the insertion plate is made of amorphous silicon dioxide. It may, in particular, be produced from molten silicon dioxide. It may, for example, be cut from a block of molten and resolidified silicon dioxide.

The diffusion barrier preferably has a density of at least 90% by volume. Its function as a diffusion barrier is also ensured by this. In particular, impurities are effectively prevented from diffusing through pores of the diffusion barrier into the silicon melt.

In a further advantageous embodiment, the insertion plate is produced from aluminum oxide. It has a purity of at least 98%, preferably at least 99%, preferably at most 99.99%.

The insertion plate preferably has a density of at least 90% by volume, in particular 95% by volume. It is, in particular, closed and non-porous. This is, in particular, to be taken to mean that the insertion plate has a closed-pore configuration.

In the case of an insertion plate made of aluminum oxide, this may be monocrystalline. It may, in particular, be made of sapphire.

The insertion plate preferably has a thickness in the range from 0.001 mm to 10 mm, in particular in the range from 0.05 mm to 5 mm, in particular in the range from 0.4 mm to 1 mm. A diffusion of impurities from the crucible wall into the melt is effectively prevented at this thickness.

In an advantageous configuration, it may be provided that the insertion plate is provided with a coating of at least one substance from the quaternary system Si—C—O—N. Furthermore, the coating may consist of B—N modifications or have modifications of this type, i.e. components of boron and/or nitrogen and/or compounds thereof. It may also have mixtures of Si—C—O—N and B—N. $Si_3N_4$ or BN are possible, in particular, as the coating.

The coating may be powdery. It may have temporary organic additives. As a result, in particular, the sintering of the insertion plate on the crucible and/or on the ingot can be prevented.

To produce the device, the insertion plate or the insertion foil is arranged in the crucible.

The insertion plate or the insertion foil may, in particular, be placed in the crucible in such a way that it at least partially, in particular as far as possible completely, in particular at least 90%, in particular at least 95%, in particular at least 99%, preferably completely, covers the base wall. The insertion plate may also be arranged in the crucible in such a way that it at least partially, in particular as far as possible completely, in particular at least 50%, in particular at least 70%, covers one or optionally more of the side walls. It can be oriented here in particular parallel or concentrically with respect to the side wall. It can, in particular, be configured in such a way that it completely covers the region of the side wall adjoining the base wall.

It may be provided that the insertion plate is provided with a coating before arranging it in the container. A substance or a substance mixture from the quaternary system Si—C—O—N, in particular, may be provided as the coating. The sintering of the insertion plate on the crucible may be prevented by a coating of this type. It can, in particular, be achieved by this that the insertion plate and/or the crucible can be used several times.

However, it may also be advantageous to provide the insertion plate with a coating after arranging it in the container. The above-mentioned substances are in turn provided as the coating. It can, in particular, be achieved by a retrospective coating that the silicon melt in the container is completely without contact with respect to one or more, in particular all the walls thereof. It can, in particular, be achieved that the silicon melt does not wet the container and/or the insertion plate. As a result, a contamination of the melt or the ingot, for example with oxygen or aluminum is prevented, in particular. Moreover, the production process can be simplified by a subsequent coating.

With regard to the advantages of the method according to the invention for producing silicon blocks, reference is made to the advantages of the device according to the invention.

Further objects of the invention consist in improving silicon blocks, in particular for use in photovoltaic applications. This object is achieved by the means for separating the silicon melt in the container from the base wall thereof comprising an insertion element, by means of which the base wall is at least 50% covered, wherein the insertion element prevents the diffusion of impurities from the base wall of the container into the silicon.

A core of the invention consists in reducing, in a silicon block, the extent of the base and/or peripheral region which can generally not be used for photovoltaic applications. By reducing the extent of the edge region to values of at most 50 mm, in particular at most 30 mm, in particular at most 20 mm, in particular at most 10 mm, in particular at most 5 mm, in particular at most 3 mm, in particular at most 1 mm, the yield of the crystallization process is significantly improved. In particular, the extent of the base region in the longitudinal direction of the silicon block can be reduced to the given values here by a diffusion barrier at the base of the crucible. By arranging a diffusion barrier in the region of the side walls of the crucible, in particular the extent of the peripheral region in the lateral direction can be reduced to the given values. These measures for reducing the maximum extent of the edge region can preferably be combined with one another.

It was possible to show that the blocks produced according to the invention have a charge carrier service life averaged laterally over the core region, which at each height of the core region is at least 2 µs, in particular at least 3 µs, in particular at least 5 µs. The silicon blocks produced according to the invention therefore have a considerable enlarged fraction, which can be further processed for the use of photovoltaic applications.

Further advantages and details of the invention emerge from the description of embodiments with the aid of the drawings.

DESCRIPTION OF THE PREFERRED EMBODIMENTS

Figure 1:
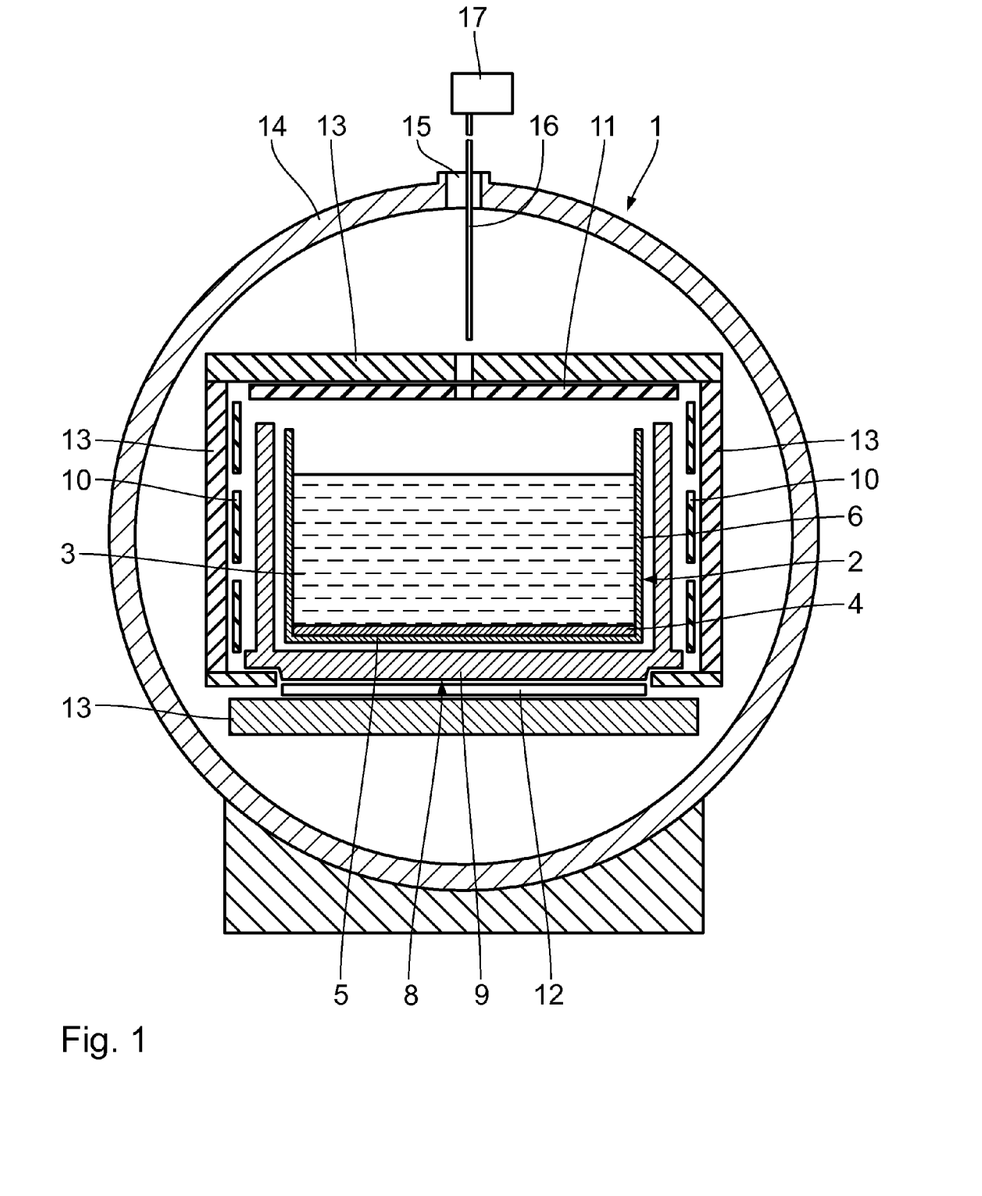
FIG. 1 schematically shows a total device for producing silicon blocks.

A device 1 for producing silicon blocks 30 according to a first embodiment will be described below with reference to FIGS. 1 and 2. The device 1 comprises a container 2 for receiving a silicon melt 3 and a covering element configured as an insertion plate 4.

Used as the container 2, is a mould, in particular a reusable mould, to receive the silicon melt 3, or a crucible, in particular a melting crucible, to melt silicon to produce the silicon melt 3.

The container 2 has a base wall 5 and at least one side wall 6. It may have a round, in particular a circular cross-section. In this case, the side wall 6 is hollow-cylindrical. The container 2 may also be cuboidal. In this case, it comprises four side walls 6. This possibility is included below, in each case, in the term "the side wall 6".

The container 2 has a diameter in the range from 10 cm to 2 m, in particular in the range from 15 cm to 100 cm. In the case of a cuboidal container 2, these details correspond to the side lengths of the base wall 5.

The base wall 5 is planar, in other words, it has a uniform thickness over its entire extent. It may also be provided with a structuring.

The base wall 5 and the side wall 6 delimit an inner space 7, which is open at one side and is used to receive the silicon melt.

The base wall 5 has a thickness in the range from 0.5 cm to 5 cm, in particular in the range from 1 cm to 3 cm. The side wall 6 has a wall thickness, which is exactly as large as the wall thickness of the base wall 5. The side wall 6 may also have a smaller wall thickness than the base wall 5.

The container 2 is preferably made of quartz or ceramic, in particular of a compound of silicon with at least one of the elements oxygen, nitrogen or carbon. The container 2 may, in particular, be made of silicon dioxide ($SiO_2$), silicon nitride ($Si_3N_4$) or silicon carbide (SiC). The material of the container 2, in particular, has a density in the range from 75% by volume to 85% by volume.

The device 1 furthermore comprises a support mould 8, which surrounds the container 2. The support mould is also open on one side. It comprises a base plate 9, which is carried by a frame not shown in the figures.

Furthermore, the device 1 comprises heating elements. Side heating elements 10, a cover heating element 11 and a base heating element 12 can be distinguished here. It is likewise possible to configure the device 1 with a single side heating element 10. Accordingly, a plurality of cover heating elements 11 and/or base heating elements 12 may be provided. The side heating elements 10 surround the container 2 laterally. The cover heating element 11 is arranged above the container 2. The base heating element 12 is arranged below the container 2.

Additionally or as an alternative to the heating elements 10, 11, 12, cooling elements may be provided laterally, above and/or below the container 2. The heating elements 10, 11, 12 and/or the cooling elements are preferably controllable. The heating elements 10, 11, 12 and the cooling elements together form a temperature control mechanism to control the melting and/or the directed solidification of the silicon in the container 2. Reference is made, for example, to DE 10 2005 013 410 B4 for details of the temperature control mechanism.

The container 2 may also be surrounded by a large number of insulation elements 13.

The container 2 may, in particular, be arranged in an outwardly sealed off crystallization chamber 14. The crystallization chamber 14 has a feed-through 15 for a flushing tube 16. The crystallization chamber 14 can be subjected to flushing gas by means of a flushing gas mechanism 17 by way of the flushing tube 16. Argon is provided, in particular, as the flushing gas. Alternatively, another inert protective gas may also be used. The atmosphere in the crystallization chamber 14 can, in particular, be controlled in a targeted manner by means of the flushing gas mechanism 17. The crystallization chamber 14 and the flushing gas mechanism 17 are also components of the device 1.

Further details of the insertion plate 4 being used as the diffusion barrier will be described below. The insertion plate 4 is mechanically rigid. This facilitates the insertion thereof in the container 2. The insertion plate 4 is preferably configured in such a way that it can be inserted with a precise fit in the container 2. It is, in particular, configured in such a way that with its help, the base wall 5 of the container 2 can be covered completely as far as possible. The base wall 5 of the container 2 can be covered in particular at least 90%, in particular at least 95%, in particular at least 99%, preferably completely, by means of the insertion plate 4. The insertion plate 4 may be in direct contact with the base wall 5. It may also be in direct contact with the side wall 6. The insertion plate 4 may lead to a spatial separation of the silicon melt 3 and the silicon crystal from the base wall 5 and/or the side walls 6 of the container 2. The insertion plate 4 may be one-part or multi-part.

A highly pure, coated so-called quartz glass plate is used, for example, as the insertion plate 4. The insertion plate 4 is, in particular, made of amorphous material. According to the first embodiment, the insertion plate 4 has at least one fraction of silicon dioxide ($SiO_2$). It has, in particular, at least one layer of silicon dioxide ($SiO_2$). It may preferably be completely produced from silicon dioxide ($SiO_2$). It may, in particular, be produced from molten amorphous silicon dioxide ($SiO_2$), for example cut from a block of molten and resolidified silicon dioxide ($SiO_2$). This leads to a particularly high density and purity of the insertion plate 4. The insertion plate 4 may, in particular, be closed-pore.

In principle, other substances, in particular silicon compounds, in particular compounds of silicon with one or more of the elements oxygen, carbon and nitrogen, and aluminum oxide, are also possible as the material of the insertion plate 4. Moreover, the covering element may consist of aluminum oxide, of multi-crystalline $Al_2O_3$ or of monocrystalline sapphire.

In general, the material of the insertion plate 4 has a coefficient of diffusion for impurities in the container 2, in particular for metals, which is smaller than the coefficient of diffusion of pure silicon for these substances. As a result, the effect of the insertion plate 4 as a diffusion barrier is ensured.

The covering plate 4 is advantageously heat resistant, at least up to a melting temperature of silicon, in particular to at least 1450° C.

The insertion plate 4 has less than 1%, in particular less than 0.1%, in particular less than 0.01%, impurities.

The insertion plate 4 may have a coating comprising at least one substance from the quaternary system Si—C—O—N. Possible coatings are, in particular, silicon carbide (SiC), silicon nitride ($Si_3N_4$) and silicon dioxide ($SiO_2$). Furthermore, the coating may consist of B—N modifications or have modifications of this type. It may also have mixtures of Si—C—O—N and B—N or consist of mixtures of this type.

The insertion plate 4 has a thickness in the range from 1 µm to 10 mm, in particular in the range from 50 µm to 5 mm, in particular in the range from 0.4 mm to 3 mm, in particular in the range to 1 mm.

The thinner the insertion plate 4, the less the heat flow from the silicon melt 3 is influenced by it. The thicker the insertion plate 4, the more reliably it can prevent a diffusion of impurities from the walls 5, 6 of the container 2 into the silicon melt 3. The given ranges have proven to be an optimal compromise to fulfill these two mutually conflicting requirements.

In order to effectively prevent the diffusion of impurities from the container 2, in particular the base wall 5 thereof, the insertion plate 4 has a low porosity. It is in particular closed-pore in configuration. It preferably has a density of at least 90% by volume, in particular at least 95% by volume. High density values of this type cannot be achieved by coatings, which are generally applied from a dispersion onto the inside of a crucible, and which have a high porosity.

The material of the insertion plate 4 preferably has a thermal coefficient of expansion, which differs by at most 10%, in particular at most 5%, in particular at most 1%, from that of the material of the base wall 5 of the container 2.

To produce the device 1 for producing silicon blocks 30, the insertion plate 4 is firstly provided. For this purpose, silicon dioxide can, in particular, be melted and solidified to form a block of a suitable size. The insertion plate 4 can then be cut from this block. The container 2 is then provided and the insertion plate 4 is arranged therein.

In different embodiments of the invention it may be provided that the insertion plate 4 is provided with a coating before being arranged in the container 2 or after being arranged in the container 2. For details of the coating, reference is made to the above description. The coating may have different functions. It may, on the one hand, facilitate the removal of the silicon block from the container 2. It may also influence the crystallization of the silicon melt 3 in the container 2. For details see DE 10 2005 028 435 A1, DE 10 2005 029 039 A1 and DE 10 2005 032 789 A1.

Moreover, sapphire can be used as the nucleus for monocrystalline or coarse-grain silicon.

When applying the coating after arranging the insertion plate 4 in the container 2, the coating can also be used to seal remaining intermediate spaces between the insertion plate 4 and the side walls 6 of the container 2 and/or with a multi-part configuration of the insertion plate 4, to seal between the individual components thereof.

The coating in particular has a thickness in the range of 0.05 mm to 0.5 mm.

To produce silicon blocks 30, in particular for photovoltaic applications, the device 1, in particular the container 2, is firstly provided with the insertion plate 4 and the insertion plate 4 is arranged in the container 2. The silicon melt 3 is then provided in the container 2. This may take place by pouring already molten silicon into the container 2 or by melting silicon in the container 2. The silicon melt 3 in the container 2 is separated by the insertion plate 4 from the base wall 5 of the container 2.

The silicon melt 3 in the container 2 is then solidified by suitable control of the heating/cooling elements 10, 11, 12. For details in this regard, reference is made, for example, to DE 10 2005 013 410 A1.

A further embodiment of the invention will be described below with reference to FIG. 3. Identical parts have the same reference numerals as in the embodiment according to FIG. 2, to the description of which reference is hereby made.

In this embodiment, a large number of insertion plates 4 are provided. These are configured in such a way that they cover the base 5 substantially without gaps. They may, in particular, form a tiling of the base wall 5. Moreover, there is also provision in this embodiment to cover the region of the side wall 6 adjoining the base wall 5 with insertion plates 4.

The insertion plates 4 to cover the side wall 6 are preferably oriented parallel to the latter. A separating joint 18 can remain between the insertion plates 4 arranged on the base wall 5 of the container 2 and the insertion plates 4 arranged on the side wall 6 of the container 2. The separating joint 18 has a free width of at most 5 mm, in particular at most 3 mm, in particular at most 1 mm.

To close the separating joint 18, a coating 19 may be provided, in particular in the region of the separating joint 18. Reference is made to the above description of the coating of the insertion plate 4 and/or the container 2 for details of the coating 19. The coating 19 forms a protection against the silicon melt 3 running behind the insertion plates 4.

In this embodiment, there is also provision to provide the side wall 6, at least in regions, with the coating 19. The side wall 6 is in particular provided in the region not covered by the insertion plates 4, in other words in the region above the insertion plates 4, with the coating 19. The coating 19 reaches, in particular, at least to a height, which is greater than a maximum filling height $h_{max}$ to be expected of the silicon melt 3 in the container 2.

A further embodiment of the invention will be described below with reference to the figures. Identical parts have the same reference numerals as in the above-described embodiments, to the description of which reference is hereby made.

Figure 4:
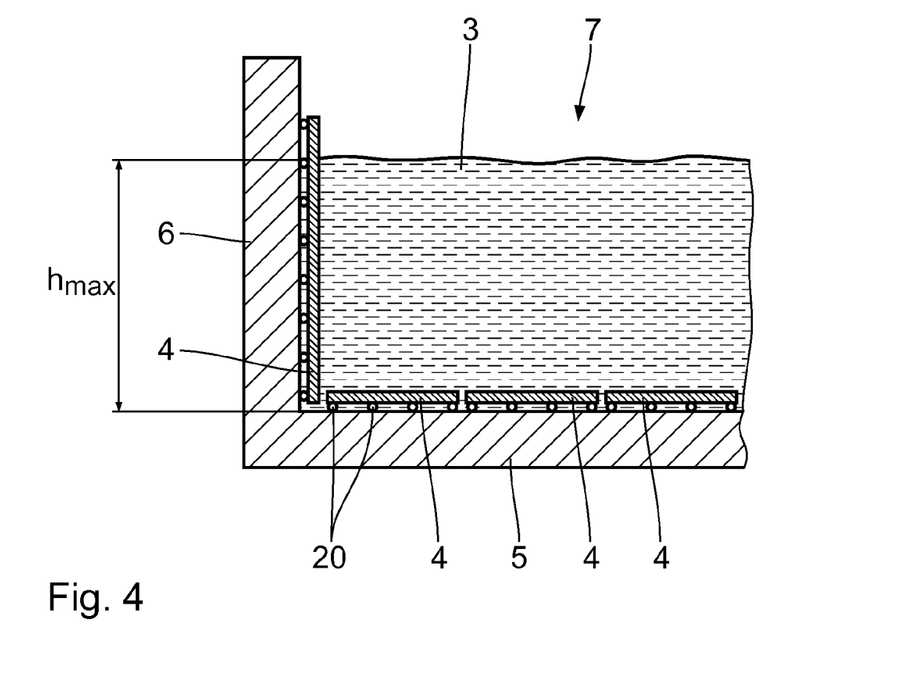
FIG. 4 shows a schematic cross-section through a container for receiving a silicon melt with a diffusion barrier according to a further embodiment.

In the embodiment shown in FIG. 4, it is provided that a coating 20 is arranged between the walls 5, 6 of the container 2 and the insertion plates 4. The coating 20 is made of a material that is difficult to sinter, for example silicon nitride ($Si_3N_4$) or silicon oxynitride (Si—O—N).

The coating 20 is applied to the walls 5, 6 of the container 2 from a dispersion, in particular a powder, with particles, the diameter of which is in the range from 0.1 µm to 10 µm.

It is provided in this embodiment that the insertion plate 4 is configured in the region of the side wall 6 in such a way that, proceeding from the base wall 5, perpendicular thereto, it has an overall extent, which is greater than the maximum filling height $h_{max}$ to be expected of the silicon melt 3 in the container 2.

A further embodiment of the invention will be described below with reference to FIG. 5. Identical parts have the same reference numerals as in the embodiments described above, to the description of which reference is hereby made. The container 2 is also provided in this embodiment with a coating 20 in the region of the side walls 6 and in the region of the base wall 5. An insertion plate 4 is in turn provided as the diffusion barrier. It is also provided in this embodiment that a large number of crystal nuclei 21 are to be arranged on the insertion plate 4. The crystal nuclei 21 are, in particular, arranged parallel to the base wall 5 of the container 2. They may, in particular, be triangular, rectangular, in particular square or hexagonal. They are, in particular, configured in such a way that the base wall 5 of the container 2 is covered by them in a tileable manner, i.e. substantially without gaps.

The crystal nuclei 21 are separated from the base wall 5 by the insertion plate 4.

It may be provided that a gap 22 is to be left between the crystal nuclei 21 and the side walls 6 of the container 2. The gap 22 may have an extent in the direction perpendicular to the side wall 6 in the range of 100 μm to 30 mm.

In principle, a single crystal nucleus 21 may also be provided. Apart from the possible gap 22, this may preferably substantially have dimensions such that the base wall 5 can be completely covered thereby.

Figure 5:
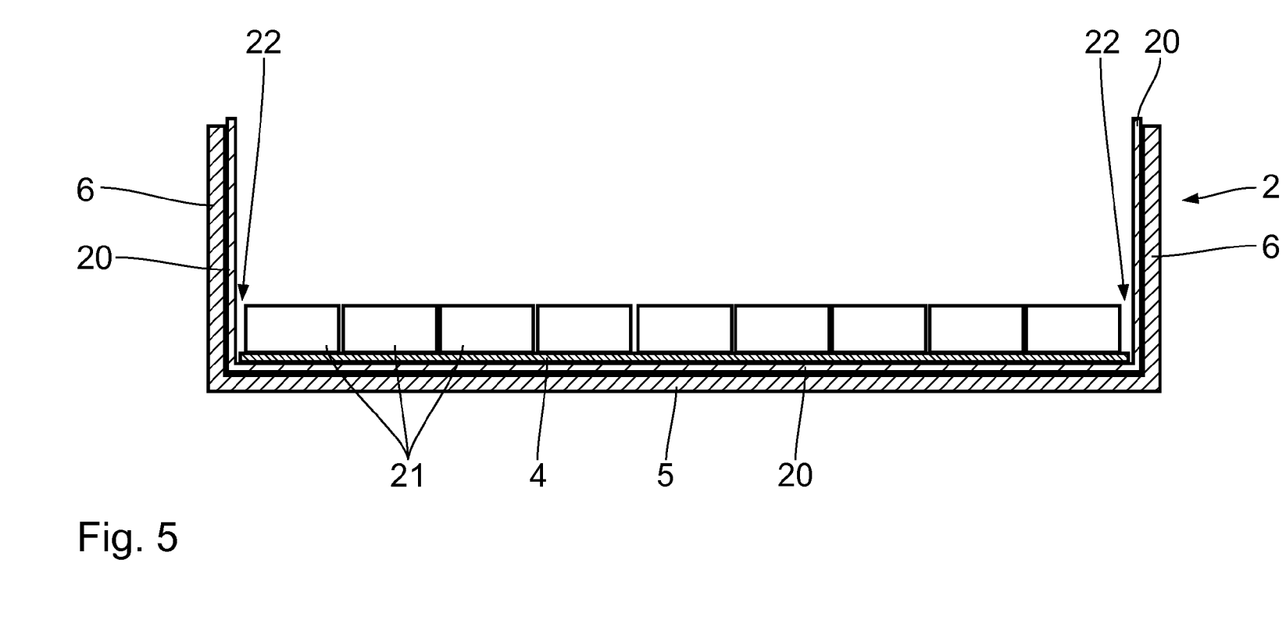
FIG. 5 shows a schematic cross-section through a container for receiving a silicon melt with a diffusion barrier according to a further embodiment.

The device according to FIG. 5 is advantageous, in particular for producing monocrystalline silicon blocks 30. Care is taken here by means of a suitable temperature control in the crucible that the temperature in the region of the diffusion barrier is below the temperature, at which a eutectic forms between the material of the diffusion barrier and silicon. The liquid silicon melt 3 preferably does not come into direct contact with the diffusion barrier. It is, in particular, separated by the crystal nuclei 21 from the diffusion barrier.

In a further embodiment, the insertion plate 4 may also itself be used as a crystal nucleus 21. An insertion plate 4 made of sapphire, for example, can be used directly as a crystal nucleus 21 for monocrystalline or coarse-grain silicon.

Figure 6A:
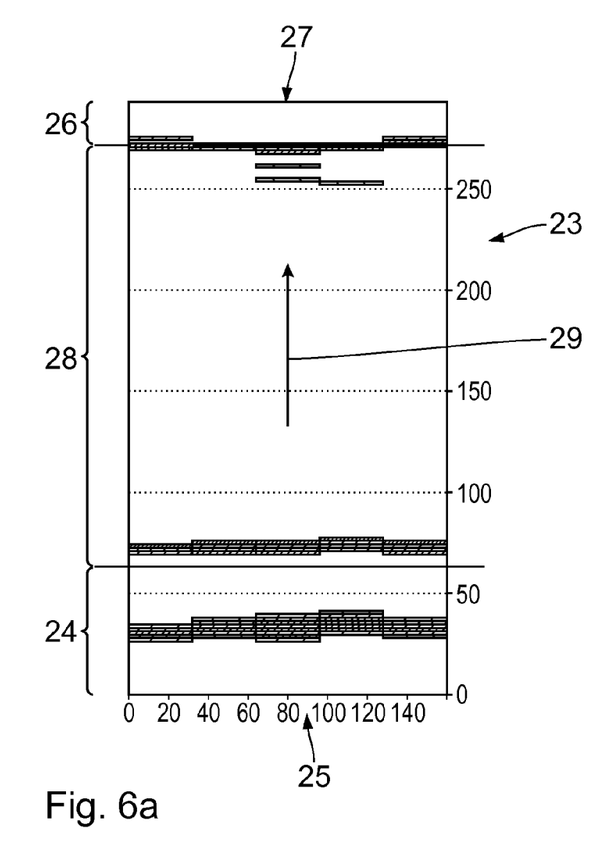
FIG. 6a shows a service life topogram of a column cut from a silicon block produced according the invention.

FIG. 6a schematically shows a service life topogram of a column 23, which has been cut out of a silicon block produced not according to the invention. Also clearly discernable is a base region 24, also simply called the base, at a first end 25 of the column 23, an upper region called a cap 26 on a second end 27 opposing the first end 25 and an intermediate region 28. The base region 24 has an extent of more than 60 millimeters in a longitudinal direction 29.

The regions 24 and 26 are defined by the averaged charge carrier service life therein. The region, in particular, of the silicon block 30, which extends from the first end 25 in the longitudinal direction 29 and in which the charge carrier service life averaged laterally, i.e. perpendicular to the longitudinal direction 29, is less than a predetermined limit value of a maximum of 3 μs, in particular a maximum of 2 μs, is called the base region 24. Accordingly, the averaged charge carrier service life in the cap 26, i.e. in the region adjoining the second end 27 of the silicon block 30 in the longitudinal direction 29, is less than this limit value.

Figure 6B:
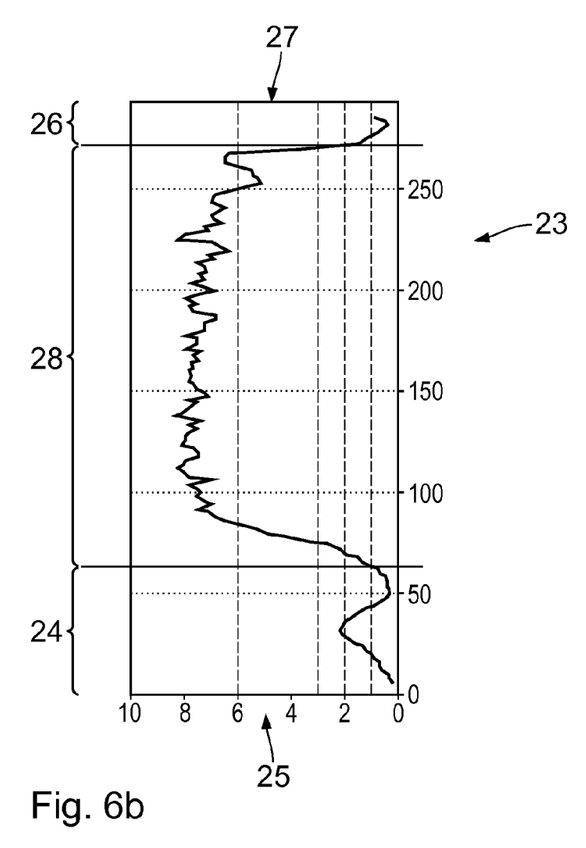
FIG. 6b shows the laterally averaged service life corresponding to the topogram according to FIG. 6a over the column height.

The course of the laterally averaged service life of the charge carrier of the column 23 shown in FIG. 6a is shown in FIG. 6b. While the averaged service life in the region of the base 24 and the cap 26 is substantially less than 2 μs, the laterally averaged service life of the free charge carrier in the intermediate region 28 is up to 8 μs. It is, in particular, substantially over the total intermediate region 28, i.e. in every desired height of the intermediate region 28, at least 2 μs, in particular a least 3 μs, in particular a least 4 μs, in particular at least 5 μs, preferably at least 6 μs.

As the base region 24 and the cap 26 are classified as less useful and therefore discarded because of the low service life of the charge carrier for further processing in photovoltaic applications, the yield of the silicon block produced by a conventional method is at most about 62%.

Figure 7:
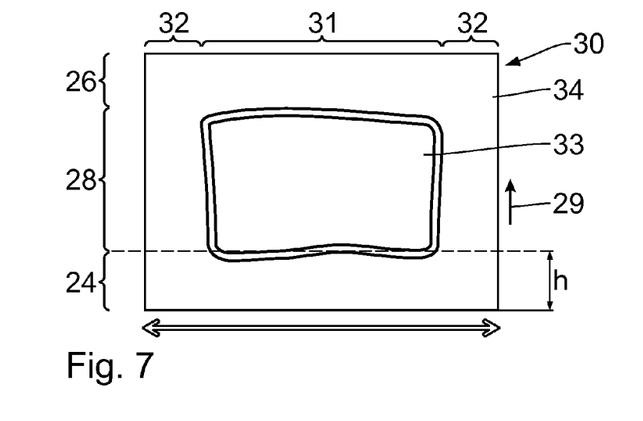
FIGS. 7 and 8 show an exemplary comparison of the charge carrier service life on vertical sections of a multicrystalline silicon block produced without or with the arrangement of a diffusion barrier in the crucible.
Figure 8:
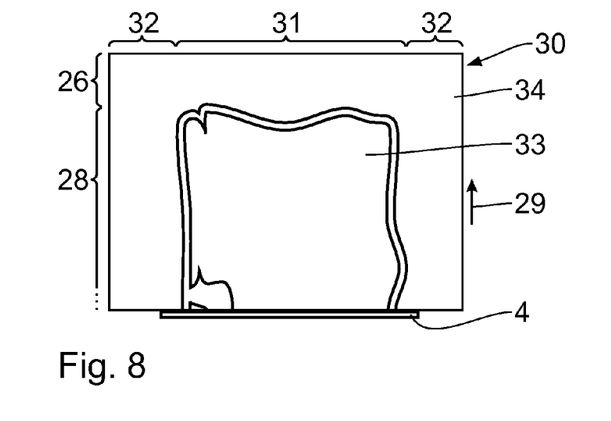

A comparison of the charge carrier service life is shown by way of example in FIGS. 7 and 8 by vertical sections through multicrystalline silicon blocks 30. The silicon block 30 shown in FIG. 7 was produced here without a diffusion barrier according to the invention. A silicon carbide (SiC) wafer, which was placed on the base wall 5 of the container 2 before the introduction of the silicon melt 3 into the container 2, was used as an insertion plate 4 in the silicon block 30 shown in FIG. 8. The SiC wafer is shown for illustration in FIG. 8.

As in FIG. 6 a, the base region 24, the cap 26 and the intermediate region 28 can in turn be clearly discerned in the silicon block 30 shown in FIG. 7. Moreover, a central region 31 and a peripheral region 32 surrounding it can be distinguished in the lateral direction, i.e. in the direction perpendicular to the longitudinal direction 29. Taken together, the section region between the intermediate region 28 and the central region 31 can be combined to form a core region 33 and the remainder of the silicon block 30 can be combined to form a peripheral region 34. Like the regions 24 and 26 in the longitudinal direction 29, the peripheral region 32 is defined by the average charge carrier service life. The averaged charge carrier service life in the peripheral region 32 is less than a predetermined limit value of a maximum of 3 μs, in particular a maximum of 2 μs.

As can be clearly seen from FIG. 8, the arrangement of the insertion plate 4 on the base wall 5 of the container 2 leads to a substantial reduction in the extent of the base region 24 in the longitudinal direction 29.

The core region 33 is also defined by its charge carrier service life. In the silicon block 30 produced according to the invention, i.e. when the insertion plate 4 is arranged on the base wall 5 of the container 2, the laterally averaged charge carrier service life in the core region 33 at each height is more than a predetermined minimum value of at least 2 μs, in particular at least 3 μs, in particular at least 4 μs, in particular at least 5 μs. As can clearly be seen from FIG. 8, the arrangement of the insertion plate 4 on the base wall 5 of the container 2 leads to a clear reduction in the extent of the base region 24 in the longitudinal direction 29 and therefore to an increase in the core region 33. In the embodiment shown, the base region 24 in the longitudinal direction 29 has an extent h of less than 1 cm. In general, the base region 24 of the silicon blocks 30 produced according to the invention in the longitudinal direction 29 proceeding from the first end 25 has an extent of at most 50 mm, in particular at most 30 mm, in particular at most 10 mm.

Accordingly, the arrangement of insertion plates 4 in the region of the side walls 6 leads to a reduction in the extent of the peripheral region 32 in the direction perpendicular to the longitudinal direction 29. The peripheral region 32, in the lateral direction, i.e. in the direction perpendicular to the longitudinal direction 29, has a thickness of at most 50 mm, in particular of at most 30 mm, of at most 10 mm.

It can, in particular, be achieved by the diffusion barrier that the edge region 34 has a maximum thickness of at most 50 mm, in particular at most 30 mm, in particular at most 10 mm, in particular at most 5 mm, in particular at most 3 mm, in particular at most 1 mm.

The yield can therefore be substantially improved by the method according to the invention. A yield of at least 70%, in particular at least 75%, in particular at least 80%, can be achieved, in particular, by the method according to the invention.

Figure 9:
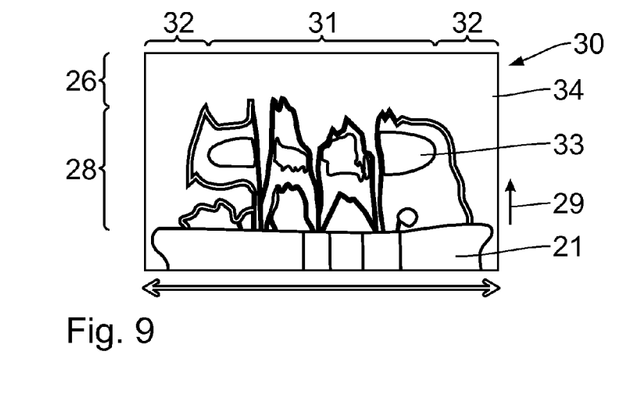
FIGS. 9 and 10 show views in accordance with FIGS. 7 and 8 of monocrystalline silicon blocks, produced with a corresponding nucleus template in the crucible.
Figure 10:
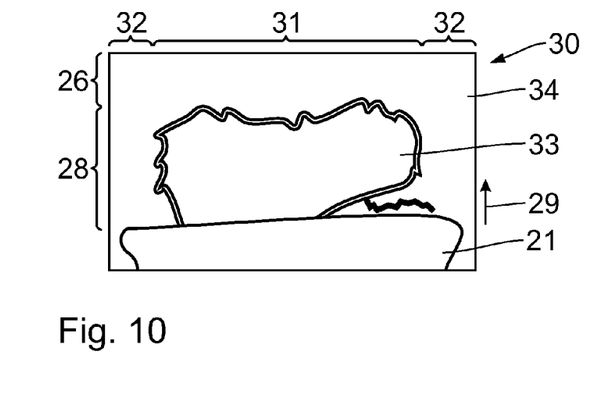

FIGS. 9 and 10, by way of example, accordingly show, as in FIGS. 7 and 8, the charge carrier service life with a vertical section through monocrystalline silicon blocks 30, which have been achieved with the aid of a template of crystal nuclei 21. FIG. 9 shows a silicon block 30 here, which was produced without the arrangement of a diffusion barrier in the crucible. In the example shown in FIG. 10, an SiC wafer on the base wall 5 was used as the insertion plate 4, which, as was shown later, slid into the region of the left-hand side wall 6 of the container 2 in FIG. 10. The clear influence of the insertion plate 4 on the charge carrier service life in the silicon block 30 can in turn be seen from the figures.

Obviously, the details of the individual embodiments, in particular the one-part or multi-part configuration of the insertion plate 4, the arrangement of insertion plates 4 in the region of the side wall 6 and the provision of coatings 19, 20 can be combined with one another as required.

In principle, it is also conceivable, in order to produce the insertion plate 4, to coat a carrier with material, which is used as a diffusion barrier for impurities in the container 2. For details of a material of this type, reference is made to the description of the insertion plate 4.

Figure 2:
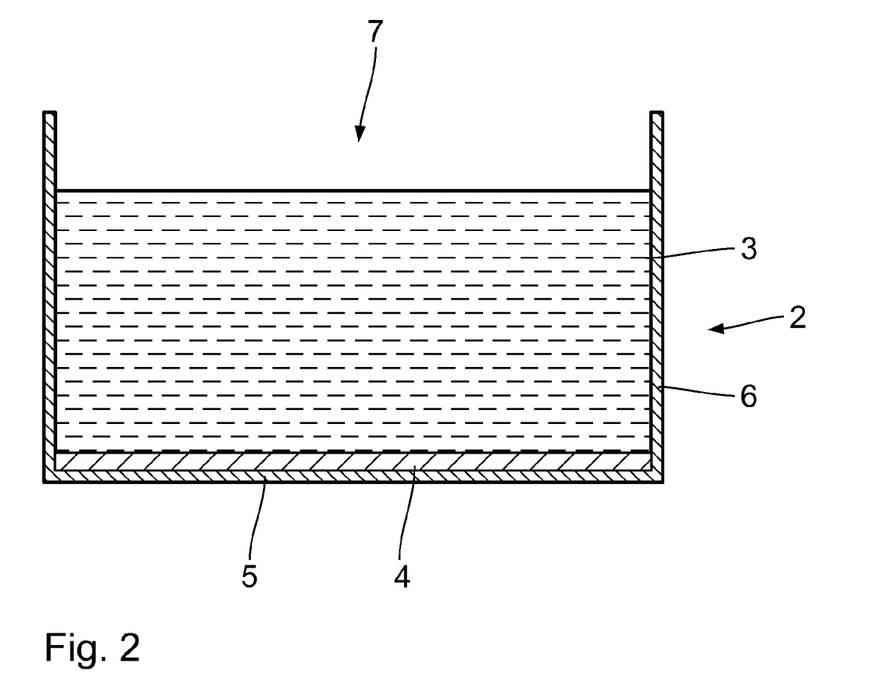
FIG. 2 shows a schematic cross-section through a container for receiving a silicon melt with a diffusion barrier according to a first embodiment.
Figure 3:
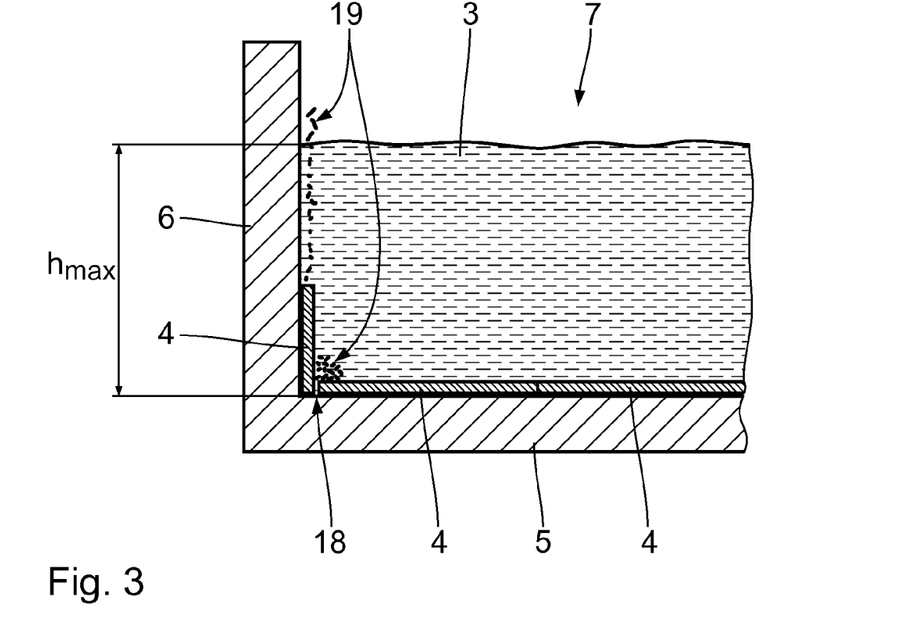
FIG. 3 shows a schematic cross-section through a container for receiving a silicon melt with a diffusion barrier according to a further embodiment.

While the insertion plate 4 in the embodiments according to FIGS. 2 to 4 is mechanically rigid, it may be advantageous to make the diffusion barrier flexible, i.e. as an insertion foil. The rigid insertion plate 4 and the flexible diffusion barrier are collectively called the covering element. The covering element comprises, in particular, the insertion plate 4 or the insertion foil.

The covering element in general leads to a separation of the silicon melt 3 from the base wall 5 of the container 2. It prevents the diffusion of impurities from the container 2 into the silicon melt 3 and/or the silicon block 30 to be produced.

A separation of this type to prevent the diffusion of impurities can also be achieved in that the insertion plate 4 is arranged separated by spacers 35 from the base wall 5 of the container 2 and arranged thereon. According to a further embodiment, the covering element is, in other words, formed by an insertion plate a, which is separated by spacers 35 from the base wall 5 of the container 2. A nucleus template or a plurality of nucleus templates, for example one or more seed crystals, in particular made of monocrystalline silicon, is used as the insertion plate 4a here. The nucleus templates are, in particular arranged abutting, in other words touching one another in a direction transverse to the base wall 5. They may also form a dense covering of the base wall 5.

The insertion plate 4a may also be configured in accordance with the above-described embodiments, or comprise a correspondingly configured insertion plate 4, in particular in addition to the nucleus templates.

In the above embodiments, the container 2 is preferably provided with a coating 20.

Instead of the silicon melt 3, a melt made of another material can obviously also be solidified by means of the device 1 according to the invention. This may, in particular, be non-ferrous metal melts, in particular with a fraction of silicon or germanium.

What is claimed is:

1. A device for producing silicon blocks for photovoltaic applications, the device comprising:
    a container for receiving a silicon melt, said container comprising a base wall and at least one side wall;
    at least one covering element for reducing diffusion of impurities from at least one of said base wall and said at least one side wall of the container into the silicon melt and the silicon block, wherein the at least one covering element is configured as an insertion plate for insertion into the container to at least partially cover at least one of the base wall and the at least one side wall of the container, wherein the at least one covering element is at least partially made of a material, which has a melting point which lies above a melting point of silicon, wherein the at least one covering element has a closed-pore configuration.

2. A device according to claim 1, wherein the covering element is configured in such a way that at least the base wall of the container can be at least 90% covered by the covering element.

3. A device according to claim 1, wherein the covering element is configured in such a way that at least the side wall of the container can be at least 90% covered by the covering element.

4. A device according to claim 1, wherein the covering element is at least partially made of a material, which has a diffusion constant in relation to silicon, which, at temperatures in the range of 20° C. to 1500° C., is at least 0.5 times as great as the diffusion constant of one of the transition metals titanium, vanadium, chromium, manganese, iron, cobalt and nickel in relation to silicon at the corresponding temperatures.

5. A device according to claim 1, wherein the covering element is at least partially made of a material, which has a diffusion constant in relation to silicon, which, at temperatures in the range of 20° C. to 1500° C., is at most 0.3 times as great as the diffusion constant of one of the transition metals titanium, vanadium, chromium, manganese, iron, cobalt and nickel in relation to silicon at the corresponding temperatures.

6. A device according to claim 1, wherein the covering element is at least partially made of a material, which has a diffusion constant in relation to silicon, which, at temperatures in the range of 20° C. to 1500° C., is at most 0.2 times as great as the diffusion constant of one of the transition metals titanium, vanadium, chromium, manganese, iron, cobalt and nickel in relation to silicon at the corresponding temperatures.

7. A device according to claim 4, wherein the covering element is simultaneously a nucleus template for the crystallization of the silicon melt.

8. A device according to claim 1, wherein the covering element has at least one fraction selected from the group of refractory metals, the compounds thereof, silicon dioxide ($SiO_2$), silicon carbide (SiC) and silicon nitride ($Si_3N_4$) and the compounds thereof, and aluminum oxide ($Al_2O_3$).

9. A device according to claim 1, wherein the covering element has a density of at least 90% by volume.

10. A device according to claim 1, wherein the covering element is produced from an amorphous silicon dioxide ($SiO_2$).

11. A device according to claim 1, wherein the covering element has a thickness in the range from 0.001 mm to 10 mm.

12. A device according to claim 1, wherein the covering element has a thickness in the range from 0.05 mm to 5 mm.

13. A device according to claim 1, wherein the covering element has a thickness in the range from 0.4 mm to 1 mm.

14. A device according to claim 1, wherein the covering element has a coating comprising at least one substance from at least one of the quaternary system Si—C—O—N and the binary system B—N.

15. A device according to claim 1, wherein the covering element has a coating of one of the group of silicon nitride ($Si_3N_4$) and boron nitride (BN).

16. A device according to claim 14, wherein one of the group of one nucleus template and more nucleus templates are used as the covering element.

17. A device according to claim 4, wherein the at least one nucleus template is made of monocrystalline silicon.

18. A device for producing silicon blocks for photovoltaic applications, the device comprising:
    a container for receiving a silicon melt, said container comprising a base wall and at least one side wall;
    a covering element arranged between the silicon melt and at least one of said base wall and said at least one side wall, said covering element reducing diffusion of impurities from said at least one of said base wall and said at least one side wall of the container into the silicon melt and a silicon block, wherein the at least one covering element comprises an insertion plate, said insertion plate at least partially covering said at least one of said base wall and said at least one side wall, wherein the at least one covering element comprises a melting point that is greater than a melting point of silicon, the covering element having a closed-pore configuration.

19. A device according to claim 18, wherein the covering element is at least partially made of a material, which has a diffusion constant in relation to silicon, which, at temperatures in the range of 20° C. to 1500° C., is at least 0.5 times as great as the diffusion constant of one of the transition metals titanium, vanadium, chromium, manganese, iron, cobalt and nickel in relation to silicon at the corresponding temperatures.

20. A device according to claim 18, wherein the covering element is at least partially made of a material, which has a diffusion constant in relation to silicon, which, at temperatures in the range of 20° C. to 1500° C., is at most 0.3 times as great as the diffusion constant of one of the transition metals titanium, vanadium, chromium, manganese, iron, cobalt and nickel in relation to silicon at the corresponding temperatures.

21. A device for producing silicon blocks for photovoltaic applications, the device comprising:
 a container for receiving a silicon melt, said container comprising a base wall and at least one side wall;
 a covering element in direct contact with at least one of said base wall and said at least one side wall, said covering element defining at least a portion of an interior space of said container for receiving the silicon melt, said covering element reducing diffusion of impurities from said at least one of said base wall and said at least one side wall of the container into the silicon melt and a silicon block, wherein the at least one covering element comprises an insertion plate, said insertion plate at least partially covering said at least one of said base wall and said at least one side wall, wherein the at least one covering element comprises a melting point that is greater than a melting point of silicon, the covering element having a closed-pore configuration.

22. A device according to claim 21, wherein the covering element is at least partially made of a material, which has a diffusion constant in relation to silicon, which, at temperatures in the range of 20° C. to 1500° C., is at least 0.5 times as great as the diffusion constant of one of the transition metals titanium, vanadium, chromium, manganese, iron, cobalt and nickel in relation to silicon at the corresponding temperatures.

23. A device according to claim 22, wherein the covering element is at least partially made of a material, which has a diffusion constant in relation to silicon, which, at temperatures in the range of 20° C. to 1500° C., is at most 0.3 times as great as the diffusion constant of one of the transition metals titanium, vanadium, chromium, manganese, iron, cobalt and nickel in relation to silicon at the corresponding temperatures.

* * * * *